United States Patent
Choi et al.

(10) Patent No.: US 10,923,473 B2
(45) Date of Patent: Feb. 16, 2021

(54) HIGH VOLTAGE LOGIC CIRCUIT

(71) Applicants: Massachusetts Institute of Technology, Cambridge, MA (US); Nanyang Technological University, Singapore (SG)

(72) Inventors: Pilsoon Choi, Cambridge, MA (US); Chirn-Chye Boon, Singapore (SG); Li-Shiuan Peh, Cambridge, MA (US)

(73) Assignees: MASSACHUSETTS INSTITUTE OF TECHNOLOGY, Cambridge, MA (US); NANYANG TECHNOLOGICAL UNIVERSITY, Singapore (SG)

( * ) Notice: Subject to any disclaimer, the term of this patent is extended or adjusted under 35 U.S.C. 154(b) by 165 days.

(21) Appl. No.: 15/999,318

(22) PCT Filed: Feb. 16, 2017

(86) PCT No.: PCT/SG2017/050070
§ 371 (c)(1),
(2) Date: Aug. 17, 2018

(87) PCT Pub. No.: WO2017/142482
PCT Pub. Date: Aug. 24, 2017

(65) Prior Publication Data
US 2020/0168605 A1   May 28, 2020

Related U.S. Application Data
(60) Provisional application No. 62/296,702, filed on Feb. 18, 2016.

(51) Int. Cl.
*H01L 27/06* (2006.01)
*H01L 27/092* (2006.01)
(Continued)

(52) U.S. Cl.
CPC .......... *H01L 27/0922* (2013.01); *G05F 1/595* (2013.01); *G05F 3/247* (2013.01);
(Continued)

(58) Field of Classification Search
CPC ..... G05F 1/595; G05F 3/247; H01L 27/0605; H01L 27/0688; H01L 27/0922;
(Continued)

(56) References Cited

U.S. PATENT DOCUMENTS 3,835,457 A * 9/1974 Yu .............................. H03K 6/02
326/70
5,896,044 A    4/1999 Walden
(Continued)

FOREIGN PATENT DOCUMENTS

| EP | 0690578 A1 | 1/1996 |
| TW | I506763 B | 11/2015 |
| WO | 2007/053686 A2 | 5/2007 |

OTHER PUBLICATIONS

P. Choi et al., "A 5.9-GHz Fully Integrated GaN Frontend Design With Physics-Based RF Compact Model," IEEE Trans. Microwave Theory & Techn., vol. 63, No. 4, pp. 1163-1173, Apr. 2015.
(Continued)

*Primary Examiner* — Kurtis R Bahr
(74) *Attorney, Agent, or Firm* — Volpe Koenig (57) ABSTRACT

A high voltage logic circuit for high voltage system application comprises a first device layer formed from a first semiconductor material and comprises a low voltage logic circuit; and a second device layer formed from a second different semiconductor material and comprising one or more components of an additional circuit for generating a high voltage logic output from a low voltage logic input from the low voltage logic circuit; wherein the first and second device layers are integrally formed. Also, a logic
(Continued)

circuit comprising: a low voltage logic input; a high supply voltage input; a circuit ground voltage input; a high voltage output; a first tail device made from a first semiconductor material; and a second tail device made from a second different semiconductor material; wherein the first and second tail devices are coupled, in series, between the high voltage output and the circuit ground voltage input; and wherein respective gates of the first and second tail devices are coupled, in parallel, to the low voltage logic input.

10 Claims, 8 Drawing Sheets

(51) Int. Cl.
| | |
|---|---|
| *G05F 1/595* | (2006.01) |
| *G05F 3/24* | (2006.01) |
| *H01L 29/16* | (2006.01) |
| *H01L 29/20* | (2006.01) |
| *H01L 29/78* | (2006.01) |
| *H02P 8/12* | (2006.01) |
| *H03K 19/0185* | (2006.01) |
| *H03K 19/0948* | (2006.01) |
| *H03K 19/20* | (2006.01) |

(52) U.S. Cl.
CPC ...... *H01L 27/0605* (2013.01); *H01L 27/0688* (2013.01); *H01L 29/16* (2013.01); *H01L 29/2003* (2013.01); *H01L 29/78* (2013.01); *H02P 8/12* (2013.01); *H03K 19/018521* (2013.01); *H03K 19/0948* (2013.01); *H03K 19/20* (2013.01)

(58) Field of Classification Search
CPC ..... H01L 29/16; H01L 29/2003; H01L 29/78; H02P 8/12; H03K 19/018521; H03K 19/0948; H03K 19/20
See application file for complete search history.

(56) References Cited

U.S. PATENT DOCUMENTS

| | | | |
|---|---|---|---|
| 6,274,430 B1 * | 8/2001 | Jan | H01L 27/105 438/258 |
| 7,535,089 B2 | 5/2009 | Fitzgerald | |
| 7,705,370 B2 | 4/2010 | Fitzgerald | |
| 8,012,592 B2 | 9/2011 | Fitzgerald | |
| 8,120,060 B2 | 2/2012 | Fitzgerald | |
| 8,368,120 B2 | 2/2013 | Lidow et al. | |
| 2006/0186454 A1 * | 8/2006 | Lee | H01L 29/42324 257/314 |
| 2007/0032089 A1 * | 2/2007 | Nuzzo | H01L 29/72 438/725 |
| 2007/0166935 A1 * | 7/2007 | Yoon | H01L 27/11568 438/296 |
| 2008/0283873 A1 * | 11/2008 | Yang | H01L 27/115 257/211 |
| 2009/0121290 A1 * | 5/2009 | Yamada | H01L 21/84 257/356 |
| 2010/0001365 A1 * | 1/2010 | Hopper | H01L 21/76264 257/501 |
| 2010/0096702 A1 * | 4/2010 | Chen | H01L 21/823814 257/369 |
| 2013/0146893 A1 | 6/2013 | Thei et al. | |
| 2014/0145208 A1 | 5/2014 | Rose et al. | |
| 2014/0217426 A1 * | 8/2014 | Inokuchi | H01L 23/50 257/88 |
| 2014/0300410 A1 | 10/2014 | Buthker et al. | |
| 2014/0367744 A1 * | 12/2014 | Briere | H01L 21/8221 257/195 |
| 2015/0099328 A1 | 4/2015 | Fitzgerald | |
| 2016/0099328 A1 | 4/2016 | Huang et al. | |
| 2016/0218195 A1 * | 7/2016 | Wu | H01L 29/42328 |
| 2016/0330795 A1 | 11/2016 | Choi et al. | |

OTHER PUBLICATIONS

N. Tipimeni, A. Koudymov, V. Adivarahan, J. Yang, G. Simin, and M. A. Khan, "The 1.6-kV AlGaN/GaN HFETs," IEEE Electron Device Letters, vol. 27, No. 9, pp. 716-718, Sep. 2006.

Y-F. Wu et al., "High-Frequency, GaN Diode-Free Motor Drive Inverter with Pure Sine Wave Output," PCIM Europe 2012, Nuremberg.

International Search Report, PCT/SG2017/050070, dated May 9, 2017, 4 pgs.

Taiwanese Office Action dated Sep. 11, 2020 for the Taiwanese Patent Application No. 106105280.

* cited by examiner

Figure 10

HIGH VOLTAGE LOGIC CIRCUIT

FIELD OF INVENTION

The present invention relates broadly to a high voltage logic circuit for high voltage system application, to a logic circuit, to a method of fabricating a high voltage logic circuit for high voltage system application, and to a method of fabricating a logic circuit.

BACKGROUND

Figure 1:
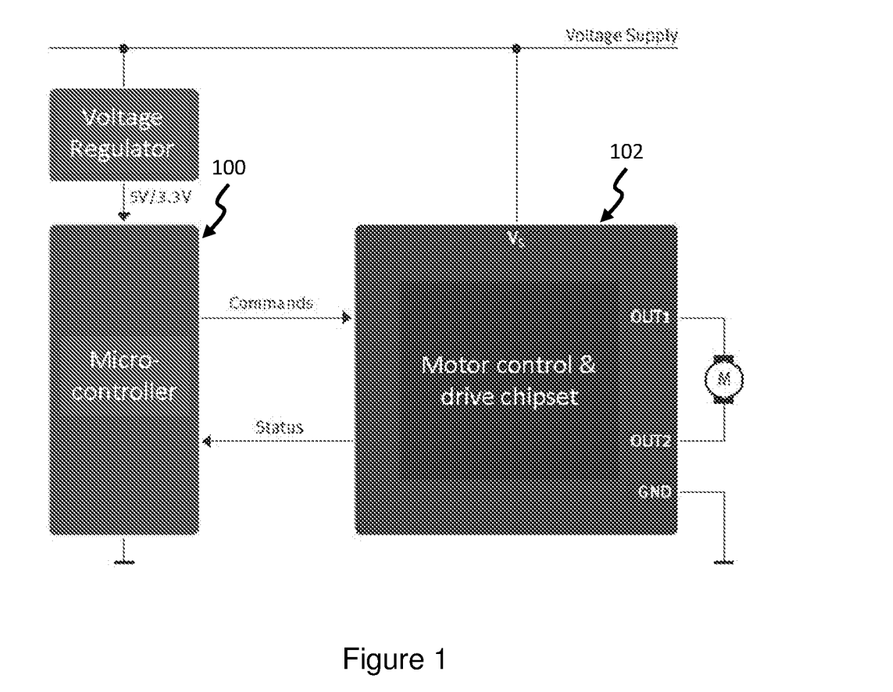
FIG. 1 shows a schematic diagram illustrating an example of drive circuitry for a DC motor.
Figure 2:
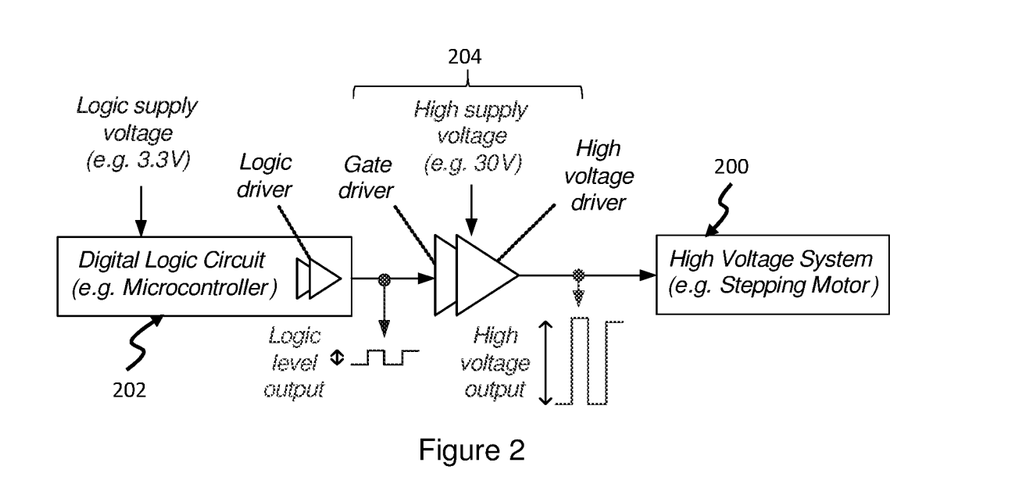
FIG. 2 shows a detailed block diagram of a conventional high voltage system interfacing with digital control circuits.

FIG. 1 shows a schematic block diagram illustrating DC or stepping motor drive circuits, showing that a microcontroller 100 operating at 3.3V or 5V logic level is separate from a motor drive chipset 102 with a high supply voltage (e.g. 12V or higher). FIG. 2 illustrates a more detailed block diagram of a general high voltage system 200 interfacing with digital logic circuits 202 (e.g. microcontroller), which demands redundant drive circuitry 204 between two independent blocks (compare 200, 202) to convert logic level input voltage to high voltage output required for the high voltage system 200 (e.g. DC or stepping motor).

As depicted in FIG. 2, digital control circuitry 202 (e.g. microcontroller) is usually implemented in complementary metal-oxide-semiconductor (CMOS) process, thus has CMOS logic level output which should be amplified though high voltage driver circuitry 204 to fit into the high voltage system 200. This increases the system complexity and size.

On the other hand, III-V devices such as Gallium Nitride (GaN) devices usually require negative bias voltages since their pinch-off voltage is negative. Although there exists an enhancement mode GaN device with a positive threshold voltage, it is difficult to control the voltage accurately during GaN device development. Thus, voltage variation is wide and sometimes below zero (i.e. negative) even for the enhancement mode devices. Specifically, most GaN devices are depletion mode FETs which demand additional negative bias circuitry [1] for proper gate biasing.

Embodiments of the present invention seek to address at least one of the above problems.

SUMMARY

In accordance with a first aspect of the present invention, there is provided a high voltage logic circuit for high voltage system application comprising a first device layer formed from a first semiconductor material and comprising a low voltage logic circuit; and a second device layer formed from a second semiconductor material different from the first semiconductor material and comprising one or more components of an additional circuit for generating a high voltage logic output from a low voltage logic input from the low voltage logic circuit; wherein the first and second device layers are integrally formed.

In accordance with a second aspect of the present invention, there is provided a logic circuit comprising a low voltage logic input; a high supply voltage input; a circuit ground voltage input; a high voltage output; at least one first tail device made from a first semiconductor material; and at least one second tail device made from a second semiconductor material different from the first semiconductor material; wherein the at least one first and second tail devices are coupled, in series, between the high voltage output and the circuit ground voltage input; and wherein respective gates of the at least one first and second tail devices are coupled, in parallel, to the low voltage logic input.

In accordance with a third aspect of the present invention, there is provided a method of fabricating a high voltage logic circuit for high voltage system application comprising providing a first device layer formed from a first semiconductor material and comprising a low voltage logic circuit; and providing a second device layer formed from a second semiconductor material different from the first semiconductor material and comprising one or more components of an additional circuit for generating a high voltage logic output from a low voltage logic input from the low voltage logic circuit; wherein the first and second device layers are integrally formed.

In accordance with a fourth aspect of the present invention, there is provided a method of fabricating a logic circuit comprising providing a low voltage logic input; providing a high supply voltage input; providing a circuit ground voltage input; providing a high voltage output; providing at least one first tail device made from a first semiconductor material; and providing at least one second tail device made from a second semiconductor material different from the first semiconductor material; wherein the at least one first and second tail devices are coupled, in series, between the high voltage output and the circuit ground voltage input; and wherein respective gates of the at least one first and second tail devices are coupled, in parallel, to the low voltage logic input.

BRIEF DESCRIPTION OF THE DRAWINGS

Embodiments of the invention will be better understood and readily apparent to one of ordinary skill in the art from the following written description, by way of example only, and in conjunction with the drawings, in which:

FIGS. 8a) to 8d) show schematic drawings illustrating an example fabrication process of III-V devices monolithically integrated with CMOS/Si devices, for use in example embodiments.

DETAILED DESCRIPTION

Example embodiments described herein can eliminate the redundancy (i.e. back-end circuitry, such as driver circuitry, in between e.g. microcontroller and high voltage system) to achieve lower power consumption and area saving, as well as to integrate the two separate blocks (i.e. digital logic circuitry and back-end circuitry) into one for a system with a smaller form-factor.

One example embodiment described herein can provide a logic inverter circuit with high voltage output that can be integrated with conventional digital logic circuits on a single die. Another example embodiment described herein can provide a NOR logic circuit with high voltage output that can be integrated with conventional digital logic circuits on a single die. Such embodiments can simplify high voltage circuits design for home/office automation, vehicular, and industrial applications.

Example embodiments described herein can provide the circuit topology of a logic circuit consisting of both CMOS and GaN devices with low voltage logic level input from CMOS circuitry and high voltage output through GaN devices. The logic circuit can be integrated with CMOS digital logic circuits on a single die using a monolithically integrated GaN+CMOS process. For example, GaN FETs can enable both high-frequency and high-efficiency operation with high breakdown voltage [2] and recently can be integrated with CMOS circuits on a single substrate [3]-[7].

Example embodiments described herein can provide a logic circuit with high voltage output that does not require additional biasing circuitry. This can simplify high voltage circuits design for home/office automation, vehicular, and industrial applications.

Figure 3:
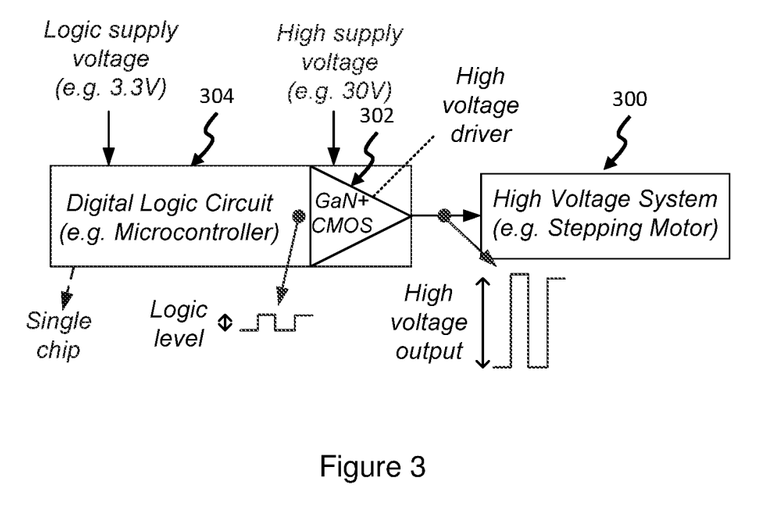
FIG. 3 shows a diagram illustrating a high voltage logic circuit for a high voltage system, including GaN+CMOS circuits integrated with conventional (or low voltage) digital logic circuits on a single chip, according to an example embodiment.

FIG. 3 shows a block diagram including GaN+CMOS circuits 302 forming a high voltage back-end circuit, for example a high voltage driver, integrated on a single chip with low voltage digital logic circuits 304 using a monolithically integrated process according to an example embodiment, which dramatically reduces the system complexity compared to the existing system shown in FIG. 2. The high voltage output from the GaN+CMOS circuits 302 is applied to a high voltage system 300 (e.g. a stepping motor).

Figure 4:
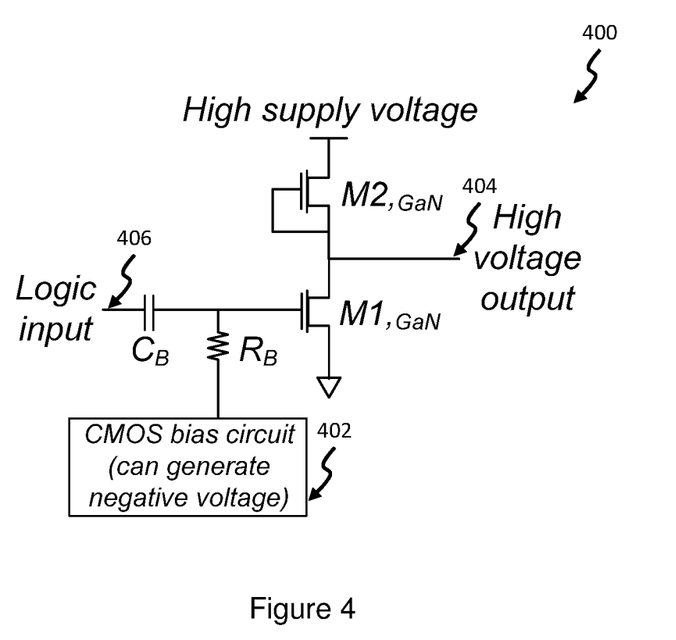
FIG. 4 shows a diagram of an example GaN inverter with CMOS bias circuitry for use in the example embodiment of FIG. 3.

FIG. 4 shows a diagram illustrating an example of the back-end circuitry in the form of an inverter 400 with depletion mode GaN FETs M1, M2, and a CMOS bias circuit 402, which can be used in the high voltage back-end circuitry integrated with the low voltage logic circuits in the embodiment described above with reference to FIG. 3. It is noted that the tail GaN device, M1, has the full voltage swing when the high voltage output 404 changes from zero to high voltage responsive to an on-state low voltage logic input 406, which can cause a slow rising time.

Figure 5:
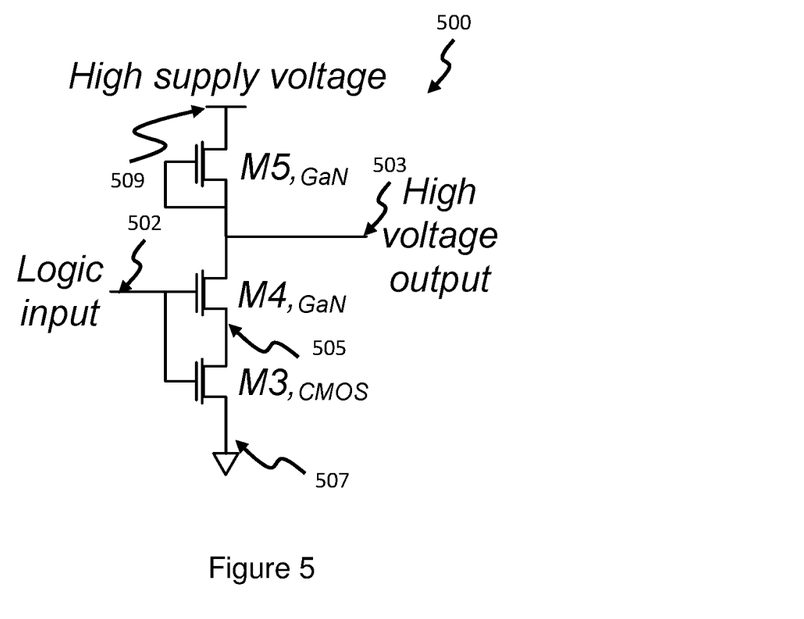
FIG. 5 shows a diagram of a GaN+CMOS inverter with no CMOS bias circuitry according to an example embodiment, which can also be used in the example embodiment of FIG. 3.

An inverter 500 circuit topology according to another example embodiment shown in FIG. 5 converts logic level low voltage at logic input 502 in CMOS circuits to high voltage at output 503 through GaN devices M4, M5 and CMOS device M3. The tail CMOS device (M3) and tail GaN device (M4) share the same logic input 502 and the breakdown voltage of the CMOS device M3 is advantageously higher than the potential at the junction 505 between the CMOS device M3 and GaN device M4 in an on-state (i.e. positive V at the logic input 502). The size of the top GaN device M5 is advantageously as small as it can be to reduce the on-state current consumption of the inverter 500.

As depicted in FIG. 5, the tail configuration M3, M4 has the same logic input 502 sharing the Silicon (Si) gate of the CMOS FET M3 with the GaN gate of the GaN FET M4, so when logic high of e.g. 3.3V is applied, the GaN FET M4 is turned more ON compared to, for example, a configuration in which the GaN-gate of the GaN FET M4 would be fixed at 0V. As a result, the on-resistance is advantageously lower and the voltage drop (Vds) will be advantageously lower in the series combination of GaN+Si Gate FETs M4, M3 according to this example embodiment. Thus, the static power loss in the on-state should advantageously be lower according to the example embodiment.

Additionally, the tail GaN device M4 which originally requires a negative DC gate bias due to its depletion mode operation advantageously no longer requires bias circuitry in the example embodiment because the tail CMOS device M3 which is turned off in an off-state (i.e. 0V at the logic input 502) makes the GaN device M4 disconnected from the circuit ground input 507. Thus, the tail GaN device M4 doesn't have the full voltage swing and slow rising time issue since its source voltage at the junction 505 is not grounded in an off-state (i.e. 0V at the logic input 502), as shown in FIG. 6, whereas the tail GaN device M1 of the inverter 400 in FIG. 4 has the full voltage swing while switching.

As depicted in FIG. 5, tail devices FETs M3 and M4 are coupled, in series, between the high voltage output 503 and a circuit ground input 507. The top GaN device M5 is coupled between a high supply voltage input 509 and the high voltage output 503.

The inverter 500 can also be used in the high voltage back-end circuitry integrated with the low voltage logic circuit in the embodiment described above with reference to FIG. 3.

Figure 6:
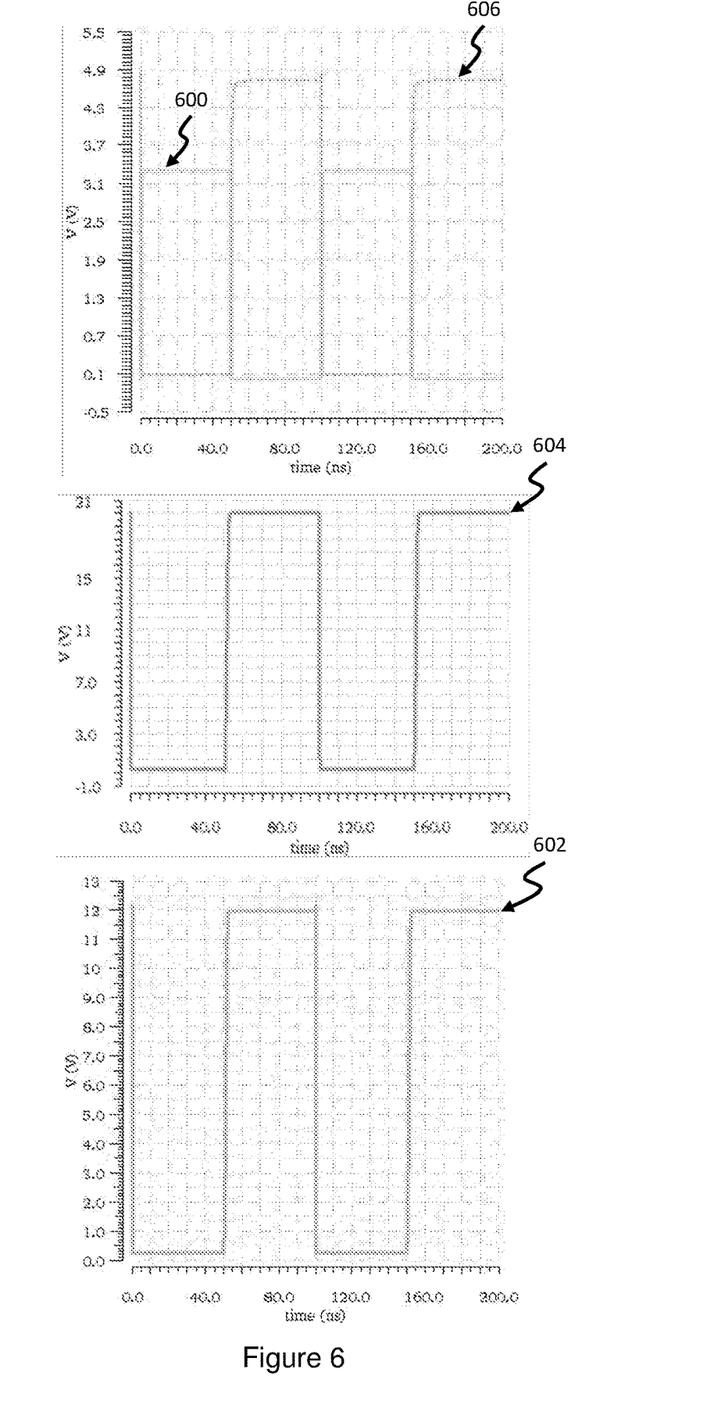
FIG. 6 shows simulation waveforms of a circuit according to an example embodiment with different high supply voltages, while logic supply is 3.3V.

FIG. 6 shows simulation waveforms of a high voltage system according to an example embodiment, showing that 3.3V logic input 600 can be converted to different higher voltage logic outputs 602, 604 depending on high supply voltages, without additional driving and/or biasing circuitry. FIG. 6 also shows the drain voltages 606 of the 3.3V CMOS device (compare M3 in FIG. 5).

Figure 7:
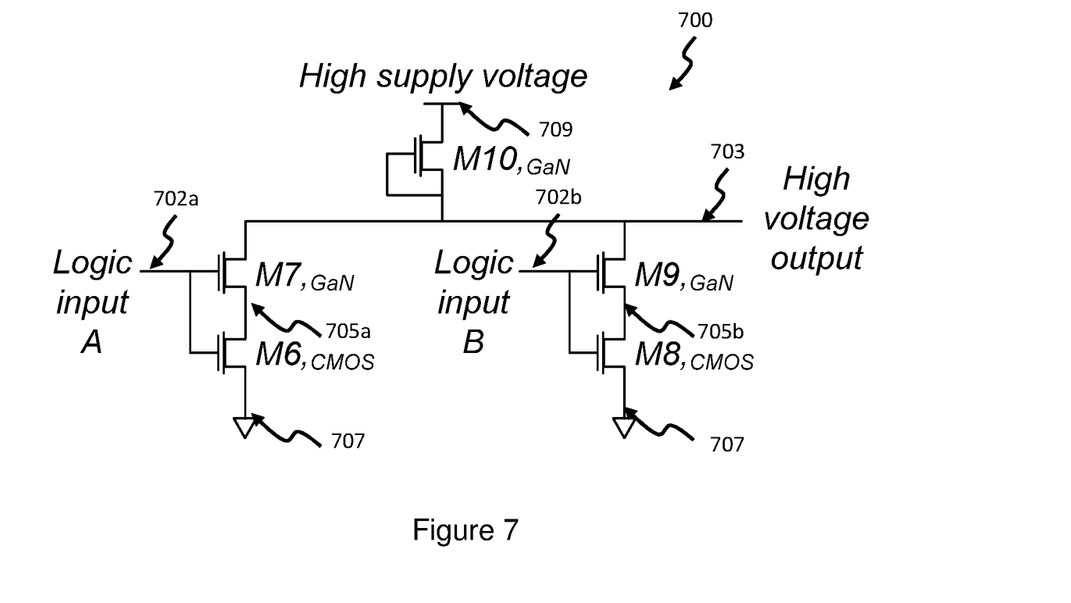
FIG. 7 shows a diagram of a GaN+CMOS NOR logic circuit with no CMOS bias circuitry according to an example embodiment, which is can also be used in the example embodiment of FIG. 3.

A NOR logic circuit 700 topology according to another example embodiment shown in FIG. 7 converts two logic level voltages at logic inputs 702a,b in CMOS circuits to high voltage at output 703 through GaN devices M7, M9, M10 and CMOS devices M6, M8. The tail CMOS device M6 and tail GaN device M7 share the same logic input 702a. The tail CMOS device M8 and tail GaN device M9 share the same logic input 702b. The breakdown voltage of the CMOS devices, M6, M8, is advantageously higher than the potential at the junctions 705a,b, respectively, between the CMOS and GaN devices in on-state (i.e. positive V at the respective logic inputs 702a,b). The size of the top GaN device, M10, is advantageously as small as it can be to reduce the on-state current consumption of the NOR logic 700.

As depicted in FIG. 7, the tail configurations M6, M7 has the same logic input 702a sharing the Silicon (Si) gate of the CMOS FET M6 with the GaN gate of the GaN FET M7 so when logic high of e.g. 3.3V is applied at logic input 702a, the GaN FETs M7 is turned more ON compared to, for example, a configuration in which the GaN-gate of the GaN FETs M7 would be fixed at 0V. As a result, the on-resistance is advantageously lower and the voltage drop (Vds) will be advantageously lower in the series combinations of GaN+Si Gate FETs M6, M7 according to this example embodiment. Similarly, the tail configurations M8, M9 has the same logic input 702b sharing the Silicon (Si) gate of the CMOS FET M8 with the GaN gate of the GaN FET M9 so when logic high of e.g. 3.3V is applied at logic input 702b, the GaN FETs M9 is turned more ON compared to, for example, a configuration in which the GaN-gate of the GaN FETs M9 would be fixed at 0V. As a result, the on-resistance is advantageously lower and the voltage drop (Vds) will be advantageously lower in the series combinations of GaN+Si Gate FETs M8, M9 according to this example embodiment. Thus, the static power loss should advantageously be lower according to the example embodiment.

Additionally, the tail GaN devices M7, M9 advantageously no longer require bias circuitry in the example embodiment because the tail CMOS devices M6, M8, which are turned off in an off-state (i.e. 0V at the respective logic inputs 702a,b) makes the GaN devices M7, M9 disconnected from the circuit ground input 707. Thus, the tail GaN devices M7, M9 don't have the full voltage swing and slow rising time issue since their source voltages at the junctions 705a,b, respectively, are not grounded in their respective off-states (i.e. 0V at the respective logic inputs 702a,b).

As depicted in FIG. 7, tail devices FETs M6 and M7 on the one hand, and tail devices FETs M8 and M9 on the other hand are coupled, in series, between the high voltage output 703 and the circuit ground input 707. The top GaN device M10 is coupled between a high supply voltage input 709 and the high voltage output 703.

The NOR logic circuit 700 can also be used in the high voltage back-end circuitry integrated with the low voltage logic circuit in the embodiment described above with reference to FIG. 3.

Figure 8:
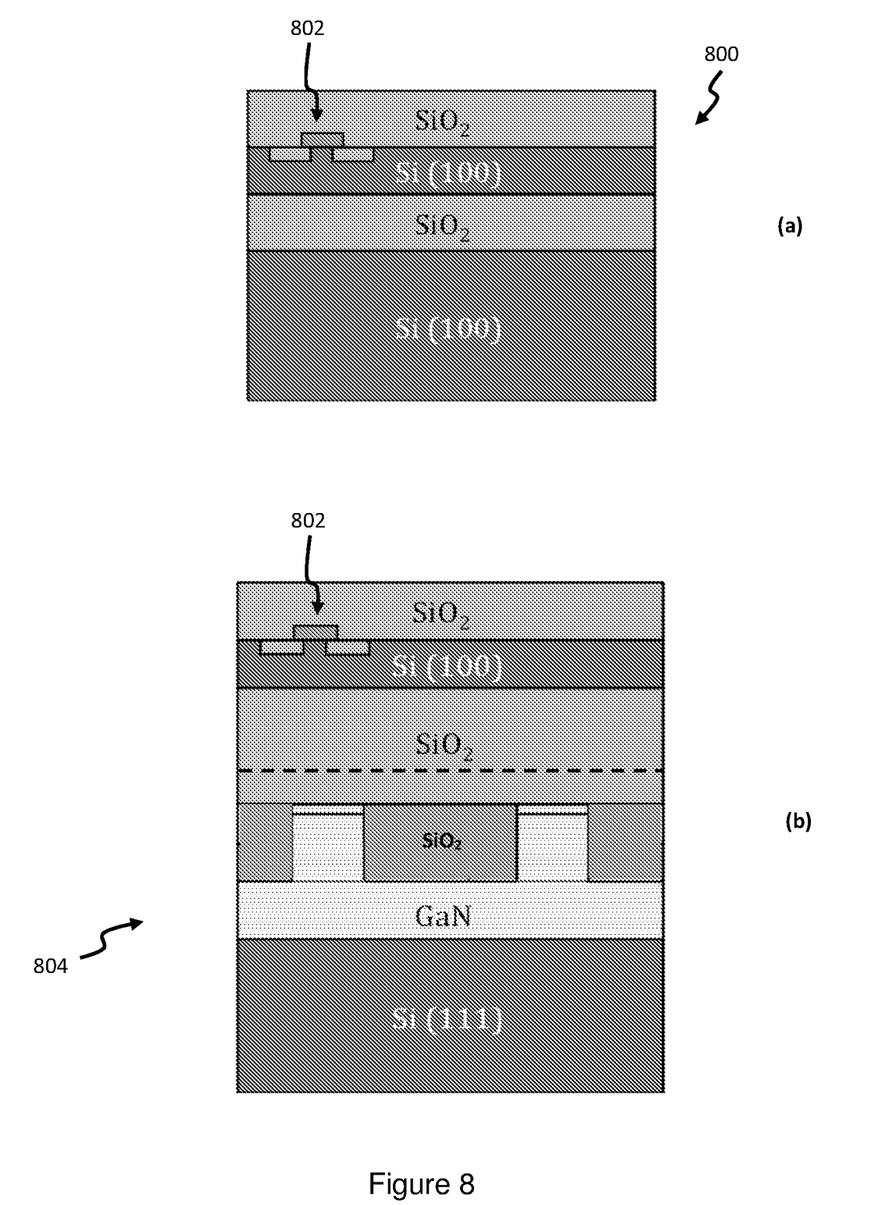

To enable monolithic integration of III-V materials with CMOS in the fabrication of the example embodiments of the present invention described above, a vertically integrated process was utilized, referred to hereinafter as the LEES process. Specifically, the LEES process is based on conventional front-end silicon CMOS processing by a commercial foundry, followed by III-V integration and processing in a separate facility, before returning the processed wafer back to the commercial foundry for back-end silicon CMOS processing. FIGS. 8a) to 8d) collectively illustrate an example structure of III-V monolithically integrated with CMOS/Si devices formed using the LEES process. It is to be appreciated that for the embodiments described, GaN FETs are used as an example of the III-V semiconductor devices because GaN FETs are particularly suitable for forming high-power and/or high-voltage circuits. Briefly, FIG. 8a) shows a silicon-on-insulator (SOI) wafer 800 with fabricated Si-CMOS devices 802 and FIG. 8b) depicts a Si-CMOS/GaN-on-Si wafer 804 realized by a two-step bonding technology using the wafer 800 of FIG. 8a) and a GaN-on-Silicon wafer. FIG. 8c) then shows opening of a window 806 for device isolation, and FIG. 8d) shows a schematic cross-sectional view of the monolithically integrated GaN FET devices 808 with final metal interconnection of fabricated FETs 808 and Si-CMOS devices 802.

As the LEES process described above is based on a commercial CMOS foundry, CMOS circuit design is able to leverage existing CMOS process design kits (PDKs) provided by the foundry. The III-V portion of a die used, uses a PDK, which includes III-V device models, layout p-cells, and interconnect models between III-V and CMOS devices, as will be appreciated by a person skilled in the art. The PDK is developed with a physics-based compact model of III-V devices (i.e. GaN FETs) coupled with device layout, sizing and spacing rules defined by device and process researchers, enabling CMOS with III-V circuit simulation using conventional computer-aided design (CAD) tools and layout for both the CMOS and GaN portions of the die. This integrated CAD flow enables joint CMOS with III-V circuit design and eases migration of the LEES process to commercialization.

In one embodiment, a high voltage logic circuit for high voltage system application comprising a first device layer formed from a first semiconductor material and comprising a low voltage logic circuit; and a second device layer formed from a second semiconductor material different from the first semiconductor material and comprising one or more components of an additional circuit for generating a high voltage logic output from a low voltage logic input from the low voltage logic circuit; wherein the first and second device layers are integrally formed.

The first device layer may comprise at least one component of the additional circuit. The at least one component may comprise a bias circuit. The at least one component may comprise at least one first tail transistor made from the first semiconductor material. The additional circuit may not require an additional biasing circuit for biasing of at least one second tail transistor of the additional circuit, wherein the at least one second tail transistor is made from the second semiconductor material.

The additional circuit may comprise a logic inverter circuit.

The additional circuit may comprise a NOR logic circuit.

The first semiconductor material may comprise a silicon based material.

The second semiconductor material may comprise a group III-V based material.

In one embodiments, a logic circuit is provided comprising a low voltage logic input; a high supply voltage input; a circuit ground voltage input; a high voltage output; at least one first tail device made from a first semiconductor material; and at least one second tail device made from a second semiconductor material different from the first semiconductor material; wherein the at least one first and second tail devices are coupled, in series, between the high voltage output and the circuit ground voltage input; and wherein respective gates of the at least one first and second tail devices are coupled, in parallel, to the low voltage logic input.

The logic circuit may further comprise a top device coupled between the high supply voltage input and the high voltage output. The top device may be made from the second semiconductor material. The top device may have a small size for reducing an on-state current consumption of the inverter circuit.

The logic circuit may comprise a logic inverter circuit.

The logic circuit may comprise a NOR logic circuit.

The first semiconductor material may comprise a silicon based material.

The second semiconductor material may comprise a group III-V based material.

Figure 9:
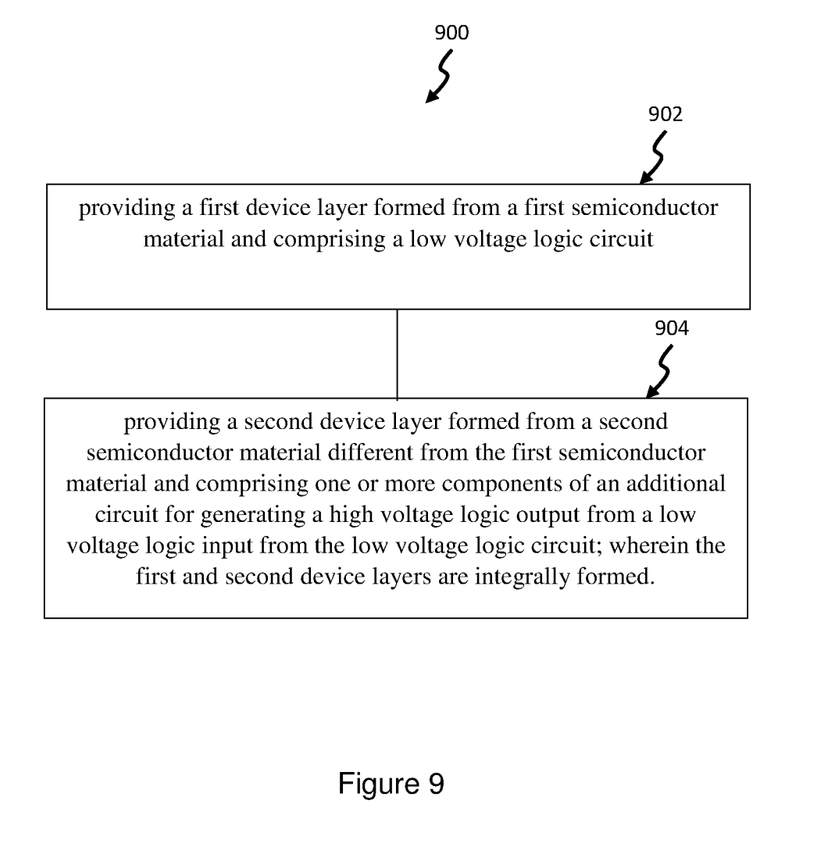
FIG. 9 shows a flowchart illustrating a method of fabricating a high voltage logic circuit for high voltage system application, according to an example embodiment.

FIG. 9 shows a flowchart 900 illustrating a method of fabricating a high voltage logic circuit for high voltage system application, according to one embodiment. At step 902, a first device layer formed from a first semiconductor material and comprising a low voltage logic circuit is provided. At step 904, a second device layer formed from a second semiconductor material different from the first semiconductor material and comprising one or more components of an additional circuit for generating a high voltage logic output from a low voltage logic input from the low voltage logic circuit is provided, wherein the first and second device layers are integrally formed.

The first device layer may comprise at least one component of the additional circuit. The at least one component may comprise a bias circuit. The at least one component may comprise at least one first tail transistor made from the first semiconductor material. The additional circuit may not require an additional biasing circuit for biasing of at least one second tail transistor of the additional circuit, wherein the at least one second tail transistor is made from the second semiconductor material.

The additional circuit may comprise a logic inverter circuit.

The additional circuit may comprise a NOR logic circuit.

The first semiconductor material may comprise a silicon based material.

The second semiconductor material may comprises a group III-V based material.

Figure 10:
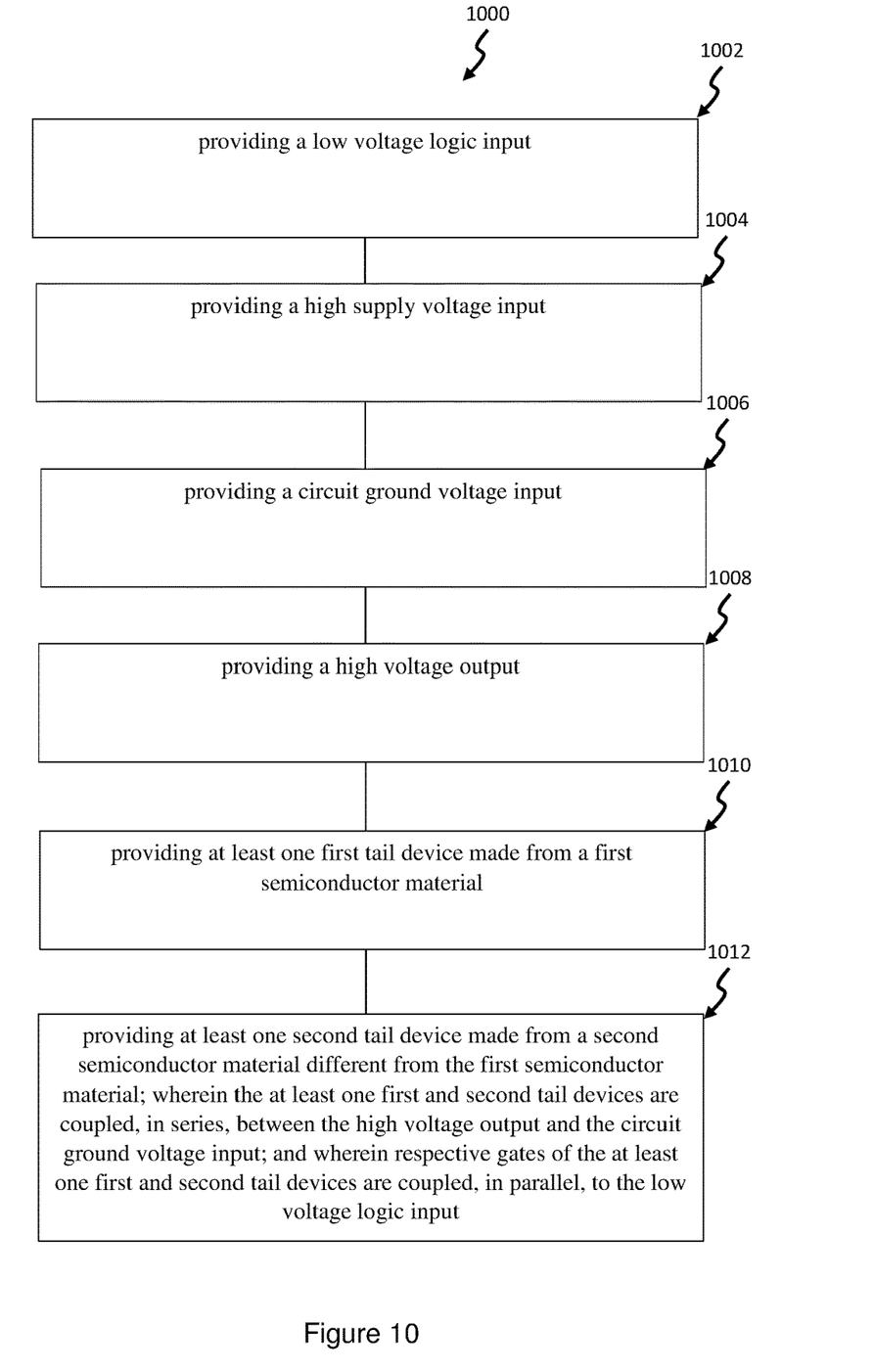
FIG. 10 shows a flowchart illustrating a method of fabricating a logic circuit, according to an example embodiment.

FIG. 10 shows a flowchart 1000 illustrating a method of fabricating a logic circuit, according to one embodiment. At step 1002, a low voltage logic input is provided. At step 1004, a high supply voltage input is provided. At step 1006, a circuit ground voltage input is provided. At step 1008, a high voltage output is provided. At step 1010, at least one first tail device made from a first semiconductor material is provided. At step 1012, at least one second tail device made from a second semiconductor material different from the first semiconductor material is provided, wherein the at least one first and second tail devices are coupled, in series, between the high voltage output and the circuit ground voltage input; and wherein respective gates of the at least one first and second tail devices are coupled, in parallel, to the low voltage logic input.

The method may further comprise providing a top device coupled between the high supply voltage input and the high voltage output. The top device may be made from the second semiconductor material. The top device may have a small size for reducing an on-state current consumption of the inverter circuit.

The logic circuit may comprise a logic inverter circuit.

The logic circuit may comprise a NOR logic circuit.

The first semiconductor material may comprise a silicon based material.

The second semiconductor material may comprise a group III-V based material.

Embodiments of the present invention can have application in small form-factor high voltage systems for home, vehicular, and industrial applications.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive. Also, the invention includes any combination of features, in particular any combination of features in the patent claims, even if the feature or combination of features is not explicitly specified in the patent claims or the present embodiments.

For example, while GaN devices have been used in the example embodiments described above, other group III-V based material devices (e.g. GaP, InP, AN) which can be sustained with high voltage and integrated with CMOS devices using a monolithically integrated process can be used.

Also, while all GaN devices in the example embodiments described herein operate in depletion mode, which is more popular as will be appreciated by a person skilled in the art, there exist enhancement-mode GaN devices which can be used in different embodiments.

REFERENCES

[1] P. Choi et al., "A 5.9-GHz Fully Integrated GaN Frontend Design With Physics-Based RF Compact Model," *IEEE Trans. Microwave Theory & Techn.*, vol. 63, no. 4, pp. 1163-1173, April 2015.
[2] N. Tipirneni, A. Koudymov, V. Adivarahan, J. Yang, G. Simin, and M. A. Khan, "The 1.6-kV AlGaN/GaN HFETs," *IEEE Electron Device Letters*, vol. 27, no. 9, pp. 716-718, September 2006.
[3] US20150099328A1
[4] U.S. Pat. No. 8,120,060
[5] U.S. Pat. No. 7,705,370
[6] U.S. Pat. No. 7,535,089
[7] U.S. Pat. No. 8,012,592

The invention claimed is:

1. A logic circuit comprising:
    a low voltage logic input;
    a high supply voltage input;
    a circuit ground voltage input;
    a high voltage output;
    at least one first tail device made from a first semiconductor material; and
    at least one second tail device made from a second semiconductor material different from the first semiconductor material;
    wherein the at least one first and second tail devices are coupled, in series, between the high voltage output and the circuit ground voltage input; and
    wherein respective gates of the at least one first and second tail devices are coupled, in parallel, to the low voltage logic input.

2. The logic circuit of claim 1, further comprising a top device coupled between the high supply voltage input and the high voltage output.

3. The logic circuit of claim 2, wherein the top device is made from the second semiconductor material and/or wherein the top device has a small size for reducing an on-state current consumption of the inverter circuit.

4. The logic circuit of claim 1, wherein the logic circuit comprises a logic inverter circuit or a NOR logic circuit.

5. The logic circuit of claim 1, wherein the first semiconductor material comprises a silicon based material, and the second semiconductor material may comprise a group III-V based material.

6. A method of fabricating a logic circuit comprising:
    providing a low voltage logic input;
    providing a high supply voltage input;
    providing a circuit ground voltage input;
    providing a high voltage output;
    providing at least one first tail device made from a first semiconductor material; and
    providing at least one second tail device made from a second semiconductor material different from the first semiconductor material;
    wherein the at least one first and second tail devices are coupled, in series, between the high voltage output and the circuit ground voltage input; and
    wherein respective gates of the at least one first and second tail devices are coupled, in parallel, to the low voltage logic input.

7. The method of claim 6, further comprising providing a top device coupled between the high supply voltage input and the high voltage output.

8. The method of claim 7, wherein the top device is made from the second semiconductor material and/or wherein the top device has a small size for reducing an on-state current consumption of the inverter circuit.

9. The method of claim 6, wherein the logic circuit comprises a logic inverter circuit or a NOR logic circuit.

10. The method of claim 6, wherein the first semiconductor material comprises a silicon based material, and the second semiconductor material may comprise a group III-V based material.

* * * * *